United States Patent
Rusu et al.

(10) Patent No.: US 6,596,980 B2
(45) Date of Patent: Jul. 22, 2003

(54) METHOD AND APPARATUS TO MEASURE STATISTICAL VARIATION OF ELECTRICAL SIGNAL PHASE IN INTEGRATED CIRCUITS USING TIME-CORRELATED PHOTON COUNTING

(75) Inventors: Stefan Rusu, Sunnyvale, CA (US); Harry Muljono, Union City, CA (US); Gary L. Woods, Sunnyvale, CA (US); Jeremy A. Rowlette, Palo Alto, CA (US); Dean J. Grannes, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 122 days.

(21) Appl. No.: 09/944,240

(22) Filed: Aug. 31, 2001

(65) Prior Publication Data

US 2003/0042439 A1 Mar. 6, 2003

(51) Int. Cl.$^7$ ................................. H01L 31/00

(52) U.S. Cl. ..................... 250/214.1; 324/753

(58) Field of Search .................. 250/214.1, 214 R, 250/559.4; 324/750–753, 765, 575, 763, 536; 356/73, 237.4, 237.5

(56) References Cited

U.S. PATENT DOCUMENTS 5,940,545 A    8/1999  Kash et al.
6,483,327 B1 * 11/2002  Bruce et al. ................ 324/752

OTHER PUBLICATIONS

Rusu, Stefan, et al., "Backside Infrared Probing for Static Voltage Drop and Dynamic Timing Measurements," ISSCC 2001 / Session 17 / TD:3D Technologies and Measurement Techniques / 17.5, Feb. 7, 2001, (9 pages).

Kash, J.A., et al., "Hot Luminescence from CMOS Circuits: A Picosecond Probe of Internal Timing," Phys. Stat. Sol. (b), Aug. 1, 1997, pp. 507–516.

Tsang, J.C., et al., "Picosecond hot electron light emission from submicron complementary metal–oxide–semiconductor circuits," Appl. Phys. Lett., Feb. 17, 1997, pp. 889–891, vol. 70, No. 7, American Institute of Physics.

Bude, Jeff, et al., "Hot–carrier luminescence in Si," Physical Review B, Mar. 15, 1992, pp. 5848–5856, vol. 45, No. 11, American Institute of Physics.

* cited by examiner

*Primary Examiner*—Que T. Le
(74) *Attorney, Agent, or Firm*—Blakely, Sokoloff, Taylor & Zafman LLP

(57) ABSTRACT

Time-correlated photon counting is used to measure integrated circuit (IC) performance related to signal jitter (such as clock jitter) in a manner that is non-invasive to the circuit or node of interest. The signal jitter is measured by counting photon emissions at various nodes of interest across a controlled collapse chip connect (C4) mounted die, without interfering with the normal operation of the circuit of interest. This increases the precision and accuracy of the measurement of signal jitter significantly, since small amounts of phase noise on a particular clock signal edge can be detected. The emitted photons can be detected and subsequently correlated to a precise time base to obtain a statistical spread of switching events in time. The range of the photon distribution can be used to reliably determine safe and reasonable timing guard bands for clock and data paths in an IC.

25 Claims, 4 Drawing Sheets

METHOD AND APPARATUS TO MEASURE STATISTICAL VARIATION OF ELECTRICAL SIGNAL PHASE IN INTEGRATED CIRCUITS USING TIME-CORRELATED PHOTON COUNTING

TECHNICAL FIELD

This disclosure relates generally to optical measurement of integrated circuit performance, and in particular but not exclusively, relates to measurement of statistical variation of electrical signal phase in integrated circuits (such as for signal jitter) using a time-correlated photon counting system.

BACKGROUND

Microprocessor designers are continuously trying to design faster and more powerful microprocessors. The speed of a microprocessor can at times, however, be limited based on various factors present in the overall system. One of these factors is a periodic electrical clock signal. The microprocessor performs its operations, timing, and synchronization based on the edges of the clock signal. Due to inherent deficiencies in the clock signal, microprocessors typically have to be designed to account for such deficiencies and therefore may not be able to operate as optimally as desired.

As an illustration, a deficiency in the clock signal is signal jitter, which is a perturbation in phase. This jitter is typically caused by random voltage fluctuations in nodes of the circuit but can also be influenced by factors such as the type of circuit, semiconductor material used, operating conditions, and so on. Because of this jitter, the edges of the clock signal do not always exactly occur at the same time for all cycles and instead vary randomly from one clock edge to another.

Due to this jitter, microprocessors are designed to operate within "guard band" error margins. That is, the operations of the microprocessor that are dependent on the clock edges are delayed until it is certain that the fluctuating edges of the clock signal have occurred sometime during the guard bands, and then the microprocessor proceeds with its operations after the guard bands have passed. Implementation of longer guard bands ensures that clock edges have occurred, but undesirably causes the microprocessor to lose operating speed since it must delay its operations until after the guard bands have passed. In contrast, implementation of shorter guard bands does improve speed of the microprocessor, but operational errors may occur if clock edges fall outside of the guard bands.

These problems are multiplied if there are multiple clocks on a chip and/or if the clock(s) branch out to a tree. If there is error at one part of the chip due to clock jitter, then the error and the clock jitter can propagate to the other circuit parts of the chip and cause synchronization and timing problems.

In an effort to measure circuit performance to determine the jitter characteristics, several techniques are used. One technique is to use mechanical pico probes. The mechanical probe is placed on a node, and the signal is measured in an analog manner in an oscilloscope (by watching the clock edges). However, the mechanical probe itself introduces parasitic capacitance onto the node, and therefore, this is invasive because the mechanical probe disturbs the node by altering the circuit and contributes error to the measurement. Moreover, mechanical probing produces unsatisfactory results at high frequencies.

Another technique to measure the jitter performance is to use laser-voltage probing. With laser-voltage probing, a pulsed laser is directed at points on the device under test (DUT), such as at transistor junctions, where the index of refraction changes when the transistor switches. The reflected light can then be viewed and used as a basis for measuring the jitter. However, it is very difficult to obtain jitter measurements with this technique, and the laser itself is invasive to the DUT since it somewhat interacts with the DUT and can thus contribute error.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Figure 1:
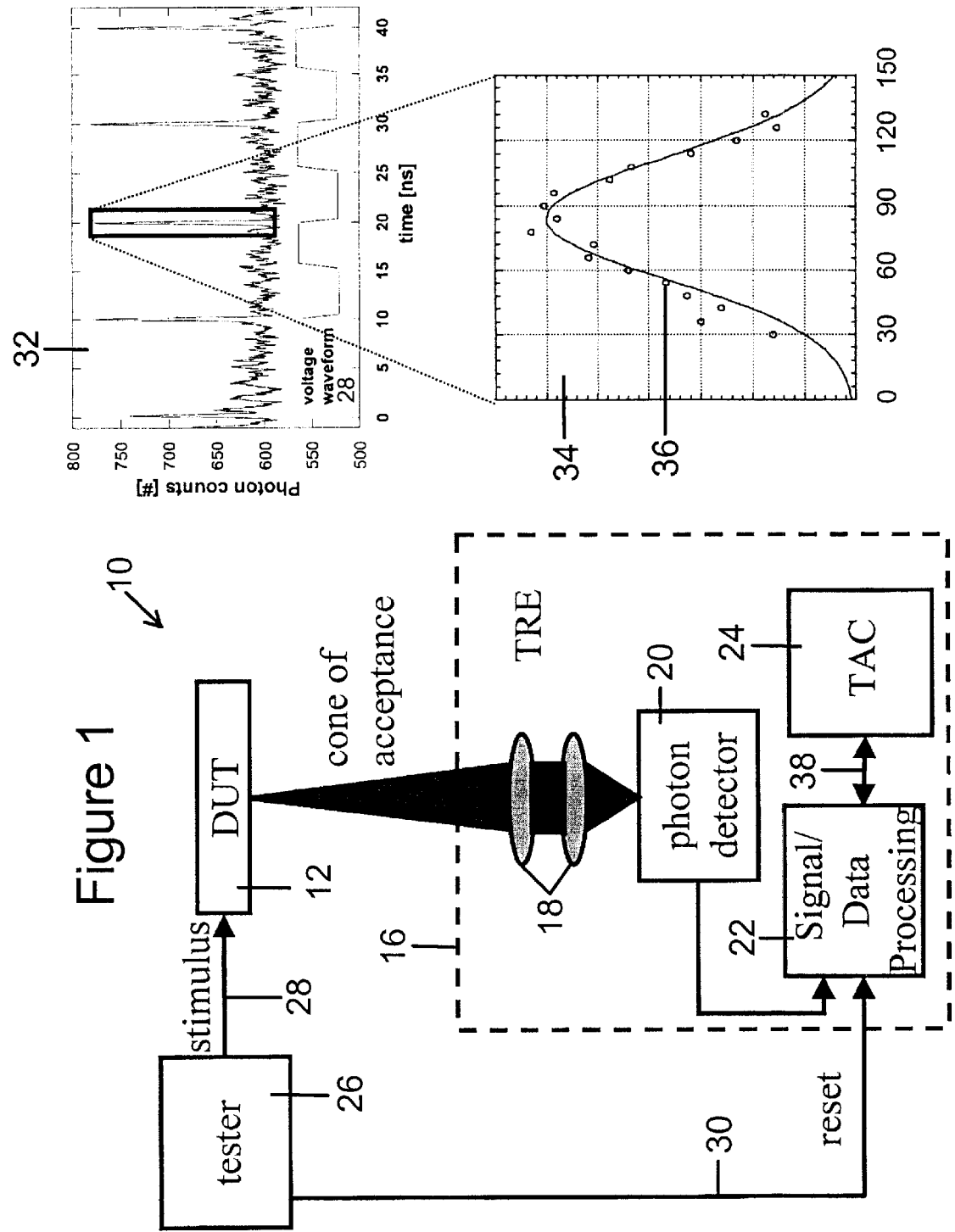
FIG. 1 is a block diagram of an embodiment of a time-correlated photon counting system.

Embodiments of a method and apparatus for measuring variation of electrical signal phase in integrated circuits (ICs) using time-correlated photon counting are described herein. In the following description, numerous specific details are provided, such as graphical data of measurements, to provide a thorough understanding of embodiments of the invention. One skilled in the relevant art will recognize, however, that these are merely illustrative and that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As an overview, an embodiment of the invention uses time-correlated photon counting to measure integrated circuit performance related to signal jitter (such as clock jitter) in a manner that is non-invasive to the circuit or node of interest. The signal jitter is measured by counting photon emissions at random nodes across a controlled collapse chip connect (C4) mounted die, in one example embodiment, without interfering with the normal operation of the circuit of interest. This increases the precision and accuracy of the measurement significantly, since small amounts of phase noise on a particular signal edge can be detected. With an embodiment, therefore, photons emitted from hot carriers in a semiconductor device can be detected and subsequently correlated to a precise time base to obtain a statistical spread of switching events in time.

The range of the photon distribution can be used to reliably determine safe and reasonable timing guard bands for clock and data paths in an IC. By knowing where guard bands should be, microprocessor timing can be optimized. Compared to mechanical or laser-voltage probing described above, an embodiment of the invention requires very little sample preparation, thereby improving the turn-around time for analysis and minimizing the need for technical support. Because an embodiment of the invention is non-invasive, the information obtained can be used to gain insight into levels of noise on a particular node under various stress scenarios.

As initial considerations, electrons and holes (the velocity of charge carriers may depend on the material used for the devices) in the presence of large electric fields are accelerated to high velocity, where they tend to lose energy to a crystal lattice through interaction with phonons (e.g., quantized lattice vibrations). During this energy exchange with the lattice, there is a finite probability of generating a photon with a wavelength in the low-energy infrared (IR) spectrum.

Signal jitter is the most applicable parameter to measure according to this concept. The hot electrons and holes in high electric field regions of a semiconductor or metal emit IR radiation both under static bias and switching conditions (see, e.g., a graph 32 in FIG. 1 below). The dominant source of emitting photons in a complementary metal oxide semiconductor (CMOS) process is an N-channel field effect transistor (FET) device. Emission from P-channel devices may also be measured, albeit their rate of photon emission is an order of magnitude less than that of N-channel devices if the electric fields are identical.

Example graphical data of static and dynamic light emission from three process generations (e.g., three different values of Vcc: 1.3V, 1.5V, and 1.8V) is shown and described in greater detail in S. Rusu et al., "Backside Infrared Probing for Static Voltage Drop and Dynamic Timing Measurements," 2001 IEEE International Solid-State Circuits Conference, Feb. 7, 2001. The linearity of the graphical data shown and described in this article demonstrates that light emission is exponential in 1/Vcc, which is a measure of the charge-accelerating electric field in channel regions of the FETs. That is, the probability of photon emission increases as Vcc increases.

In an embodiment, therefore, the dynamic light emission effect can be used to measure long-term jitter (or accumulated random or pseudo-random phase noise) of a regular and periodic signal (such as a clock signal) at any internal electrical nodes within an IC, by probing an individual transistor or other switching device, for instance. The introduction of correlated or uncorrelated noise on a switching device translates into a spreading of the photon count distribution. This spreading of the distribution provides an accurate basis from which to measure the uncertainty in the timing of switching events for high-speed ICs. In effect, therefore, what is being measured at the switching edges by the time-correlated photon counting system is a non-periodic signal (or a semi-periodic signal with random, non-periodic, phase noise).

Referring first to FIG. 1, shown generally at 10 is block diagram of an embodiment of a time-correlated photon counting system for optical, non-invasive measurements of the statistical variation of signal phase. The system 10 can be used to make such measurements on flip-chip packaged ICs, C4 mounted dies, organic land grid array (OLGA) packages, and other types of packaged circuits or other circuits that would benefit from non-invasive measurements. In FIG. 1, such a circuit (which may be based on CMOS technologies) is depicted as a device under test (DUT) 12.

After many cycles of a clock signal, the DUT 12 emits an IR (or near IR) photon from its backside in a random direction in a region labeled as a "cone of acceptance" 14 in FIG. 1. A time resolved emission (TRE) apparatus 16 is positioned to receive emitted photons in the cone of acceptance. The TRE apparatus 16 includes optics 18 to direct the emitted photons to a photon detector 20. In one embodiment, the photon detector 20 comprises a fast detector, such as a commercially available photon-counting photomultiplier tube. The photon detector 20 is not limited to photomultiplier tubes but can be chosen as to have the fastest photon-counting response available while simultaneously having high quantum efficiency and low dark counts. For example, avalanche photodiodes (APDs) can be used for this purpose. This may be a design tradeoff, as detectors do not always have both capabilities. The response of the detector can ultimately determine the minimum resolvable timing event. Generally, with a lower quantum efficiency of the detector, a larger number of loops (and therefore longer acquisition time) will be required to obtain an acquisition of the electrical signal information.

An output of the photon detector 20 is coupled to a signal/data processing unit 22. The processing unit 22 can comprise a constant fraction discrimination circuit in one embodiment and operates to assign the detected photons to time bins in a manner that will be described in further detail below. An output signal of the processing unit 22 is fed into an input of a time-to-amplitude converter (TAC) 24.

The DUT 12 and the TRE apparatus 16 are coupled to a tester 26. The tester 16 provides a stimulus signal 28 to the DUT 12 to cause the DUT 12 to emit photons. In one embodiment, the stimulus signal 28 comprises a periodic clock voltage waveform, such as that illustrated in a graph 32 in FIG. 1, having an amplitude of Vcc. The tester 16 also provides a reset signal 30 to the processing unit 22 to reset the TRE apparatus 16 for a new measurement window.

In operation, the system 10 utilizes time-correlated photon counting by first having the tester 26 apply the stimulus signal 28 to a particular circuit node of interest in the DUT 12. The duration of time that the tester 26 applies the stimulus signal 28 is the "window of interest" and can be a length of approximately 40 ns in one embodiment, such as shown in the graph 32. To obtain sufficient photon counts, the tester 26 applies the stimulus signal 28 for many loops (a window of interest is the boundary of a tester loop. The window of interest defines the length, in time, of the loop, and there is only one window of interest for a given acquisition; this window is typically repeated millions or billions of iterations in an embodiment).

During a particular loop, there is a probability that the DUT 12 will emit at least one photon (or possibly no photon). If such a photon is emitted, the photon may be emitted in the cone of acceptance 14 and directed to the photon detector 20 by the optics 18. The photon detector 20 registers the time of arrival of the photon by sending an analog signal to the processing unit 22. After some signal processing, the analog signal is fed by the processing unit 22 to the TAC 24. In one embodiment, this is a "start" signal that initiates a time-to-amplitude conversion (e.g., the TAC 24 converts the time of arrival into a pulse, with the amplitude of the pulse corresponding to the time of arrival).

Next, a trigger signal or pulse generated by the tester 26 (not the same as the reset signal 30) is sent to the TAC 24 to provide a reference point in time, which in one embodiment is a "stop" signal that provides the endpoint for the time-to-amplitude conversion process. Thus, the TAC 24 converts the time of arrival of the photon into an analog output pulse having an amplitude that corresponds to the photon's time of arrival. This analog output pulse generated by the TAC 24 is digitized by a standard analog-to-digital converter, which may comprise part of the processing unit 22 (with the signal feed back to the processing unit 22 from the TAC 24 being represented by a two-way arrow 38).

The digitized value obtained from the analog output pulse is the time of arrival of the photon for that particular window of interest. In an embodiment, the processing unit 22 places this timing information into a 1-dimensional array of discrete time slots, referred to as "time bins." The bins together define a larger specified time window (e.g., the window of interest), which can be controlled by the tester 26 via the reset signal 30.

The DUT 12 is exercised repeatedly in this manner, with running and continuous photon counts being stored in the bins. The resulting data is processed by the data processing unit 22 to provide a histogram of photon counts in time. As an illustration, the graph 32 shows the number of emitted photons counted for repeated windows of interests having a duration of approximately 40 ns. As evident from the graph 32, the number of emitted photons is greatest at the switching edges of the input voltage waveform to the DUT 12 (e.g., the stimulus signal 28). A graph 34 (a histogram) shows a magnification of a portion of the graph 32. In the graph 34, circular dots 36 each represent a bin, with the horizontal axis of the graph 34 representing the time slots of each bin. The vertical position of each dot 36 represents the number of photons placed/counted into the respective bin. As can be seen in the graph 34, the photon distribution adjacent to switching edges generally has a Gaussian shape.

The statistical distribution of the photon counts in time can be analyzed to determine the statistical variation of a signal's phase over time. In one embodiment, this may be performed by first considering that the main source of jitter (e.g., randomness in determination of the time of arrival of a photon) is the inherent jitter of the photon detector 20, which is typically referred to as the transit-time-spread (TTS)—the photon detector 20 (and sampling electronics) add jitter to the measurements. Commercially available photon-counting photomultiplier tubes have a TTS of at least approximately 25 ps, which in a system gives approximately 35 ps at least of total system jitter.

The impulse response or transfer function of the photon detector 20 is determined. Then, using this transfer function and taking into account the total system jitter derived from the TTS of the photon detector 20 and knowing the photon emission distribution from a single histogram, a de-convolution technique can be used to obtain precise representation of the signal output of the DUT 12, including its phase variations (e.g., accumulated jitter) at a particular edge. Once behavior at that particular edge is ascertained, the behavior of the signal at other edges can be ascertained due to the causality of the system.

Figure 2:
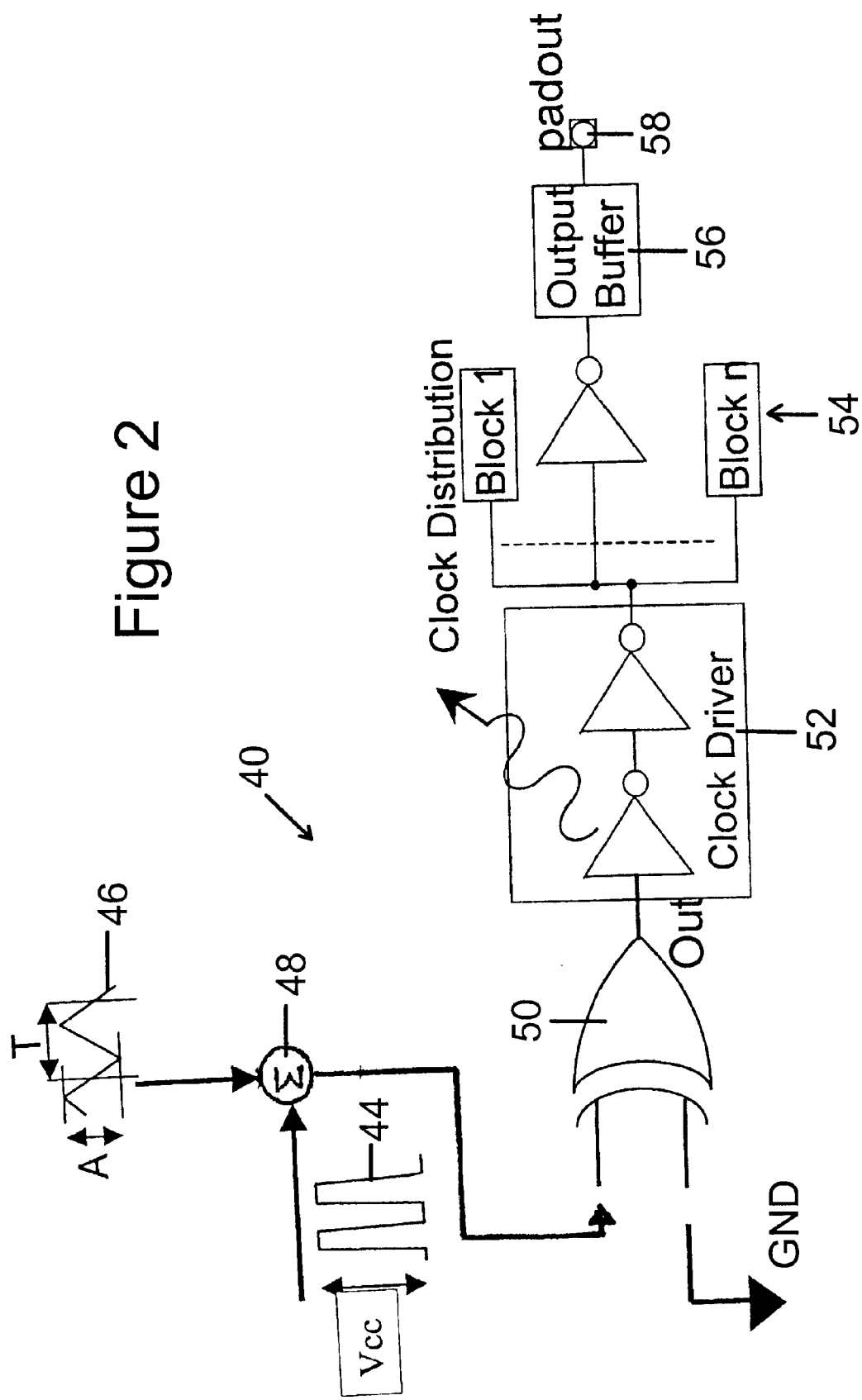
FIG. 2 is a block diagram of a circuit that can be used to calibrate the system of FIG. 1.

FIG. 2 is a block diagram of a circuit 40 that can be used to calibrate the system of FIG. 1 in accordance with one embodiment of the invention, and that can also be used as a basis for determining short and long term jitter. At least some of the components of the circuit 40 may be present on the DUT 12.

A periodic reference signal 44 (representing a clock signal having an amplitude Vcc) is summed with a known noise signal 46 (having an amplitude A and a period T) at summing circuit or node 48. Example values of A are 0 mV, 50 mV, and 200 mV, and an example value of T is 1 ms. The output of the summing node 48 forms one input into an XOR gate 50, while another input of the XOR gate 50 is coupled to ground GND.

The purpose of adding the noise signal 46 to the reference signal 44 is to add small known noise fluctuations at low frequencies to the reference signal 44. These noise fluctuations in the reference signal 44 cause propagation delays through the DUT 12 that result in phase shifts. Therefore, the measured jitter in the DUT 12 can be correlated to the known jitter at the output signal of the XOR gate 50.

A clock driver block 52 includes a transistor that is driven to switch within the DUT 12 according to the signal provided by the XOR gate 50, and emits the photons to the TRE apparatus 16. One clock of a clock distribution tree 54 is coupled to an output of the driver block 52, and sends an output to an output buffer 56. An oscilloscope may be coupled to a padout 58 so as to provide an oscilloscope signal that can be correlated with a photon count signal from the TRE apparatus 16.

In another embodiment of the circuit 40, a return signal from the clock distribution tree 54 (which has all the jitter from the clock distribution tree 54 present in it) is provided as one input to the XOR gate 50, instead of the ground GND. Also in this embodiment, the noise signal 46 is not summed with the reference signal 44—the reference signal is provided to the XOR gate 50 essentially jitter-free.

In operation, the light emission from the output of the photon detector 20 is measured as a function of time using only the jitter free reference signal 44 (e.g., a low-activity test pattern). This first photon count distribution is used as the impulse response of the system 10, and is a measure of the system's 10 intrinsic skew and jitter caused by noise in the TRE apparatus 16 and in the clock distribution tree 54.

The light emission from the photon detector 20 is then measured with the jittery return signal from the clock distribution tree 54 and the reference signal 44 as inputs to the XOR gate 50 (e.g., a high-activity test pattern). A second photon count distribution is obtained. The difference in widths between these two photon count distributions (e.g., histograms) is attributable to the incremental jitter caused by the added chip noise.

By adjusting the time window of the system 10, both short and long term clock jitter data can be obtained. The precision of the measurement can increase with longer acquisition times, given a steady repetitive stimulus to the DUT 12.

Figure 3:
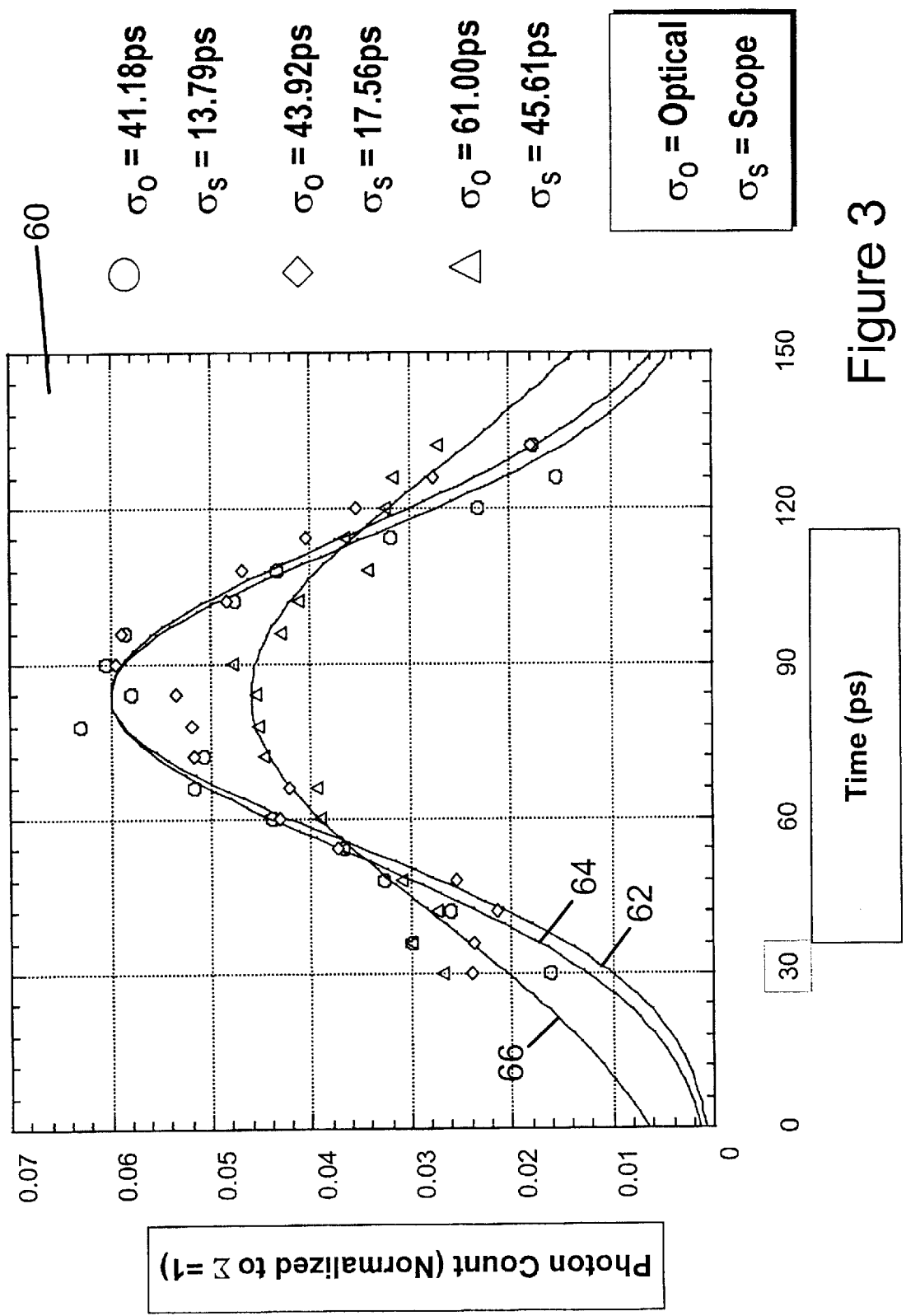
FIG. 3 is a graph of example curves of time-correlated photon counts versus jitter in accordance with one embodiment of the invention.

FIG. 3 is a graph 60 of example curves representing time-correlated photon counts versus jitter in accordance with one embodiment of the invention, where photon count has been normalized. A curve 62 represents the photon distribution when Vcc is modulated by the noise signal 46 at 0 mv at 1 kHz. A curve 64 represents the photon distribution when Vcc is modulated by the noise signal 46 at 50 mv at 1 kHz. A curve 66 represents the photon distribution when Vcc is modulated by the noise signal 46 at 200 mv at 1 kHz.

Example standard deviations $\sigma_O$ for optical measurements and $\sigma_S$ for oscilloscope measurements are indicated in FIG. 3. The curves 62–66 demonstrate that as jitter increases, so does the width of the photon count.

Figure 4:
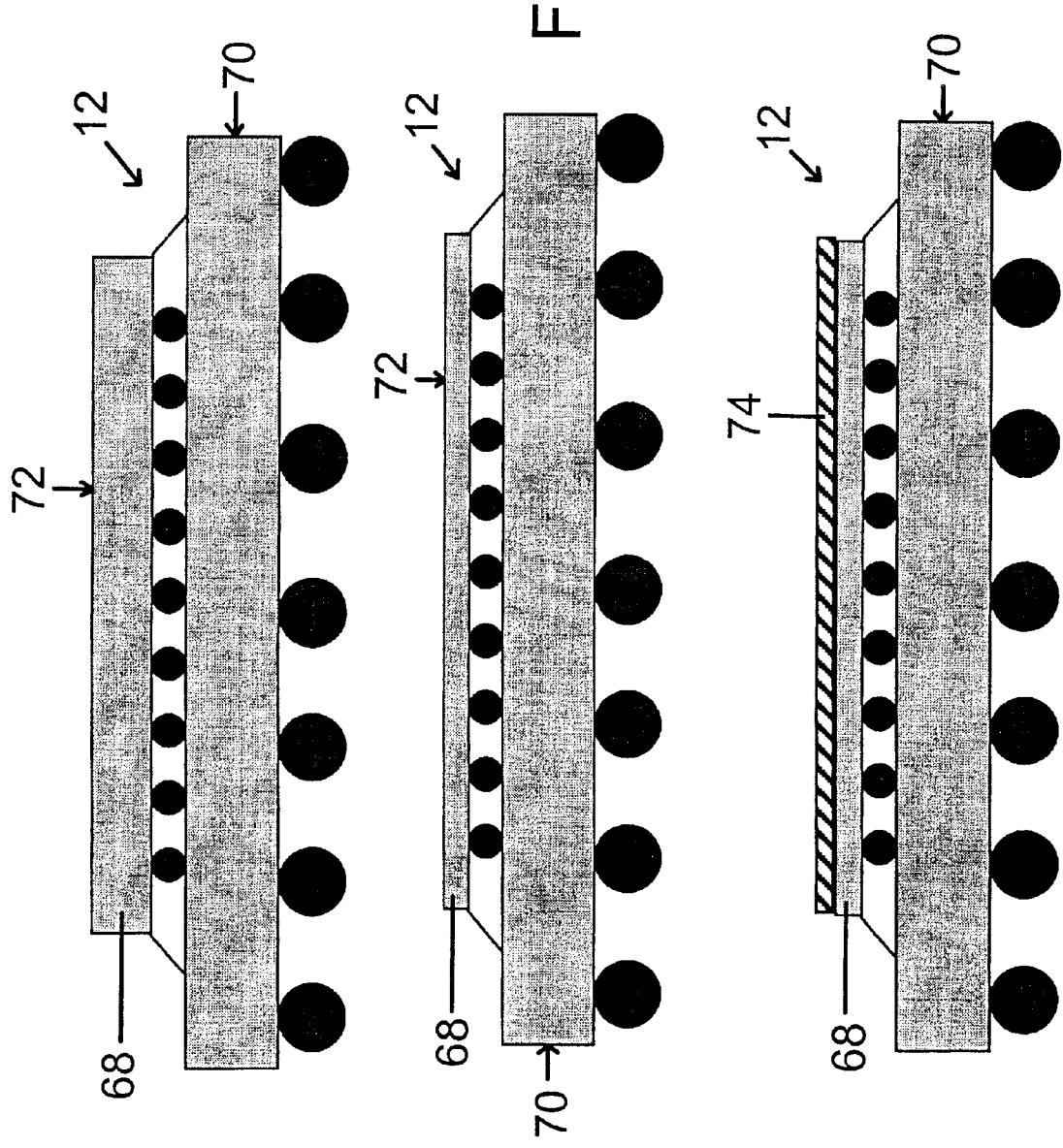
FIG. 4 is a series of diagrams illustrating preparation of a device for measurement of photon emission in accordance with an embodiment of the invention.

FIG. 4 is a series of diagrams illustrating preparation of the DUT 12 for measurement of photon emission in accordance with an embodiment of the invention. Beginning at the top illustration, the DUT 12 includes a die 68, which in one embodiment comprises a C4-mounted die packaged in a C4 OLGA package 70. The die 68 has a backside 72 and has a substrate thickness of >500 microns, as an example.

Next at the middle illustration, emission detection/capture by the TRE apparatus 16 is increased by reducing the silicon Si absorption, so that fewer photons are lost to absorption by the substrate lattice. The substrate may be thinned and polished to <150 microns, for instance. In the bottom illustration, an antireflection coating 74 is placed over the backside 72 of the thinned substrate to improve collection efficiency.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

For instance, while one embodiment of the invention has been described above with reference to being applied to CMOS devices, other embodiments of the invention are not limited to CMOS devices. Various embodiments of the invention can be used to measure III–V and II–VI compound semiconductor devices. Majority carrier devices such as metal semiconductor FETs (MESFETs), high electron mobility transistors (HEMTs), modulation doped FETs (MODFETs), or other devices can benefit from embodiments of the invention. Heterojunction bipolar transistors (HBT), which are minority carrier devices, can also be measured, since an embodiment of the system 10 can measure the IR and near IR emissions from the minority carriers in the high-field region of the reverse-biased base-collector region.

Moreover, while an embodiment has been generally described herein as measuring jitter using dynamic emission, another embodiment may also be extended to measure skew variations or other alternating current (AC) timing issues. This is because such embodiments can measure jitter, and jitter is but a random type of skew. For clock skew measurements, the two clock signals to be compared can comprise the inputs into the XOR gate 50 of FIG. 2. Additionally, an embodiment of the invention may be used to evaluate circuit performance (such as power supply drops) with regards to DC voltage measurements based on static emissions.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method, comprising:
providing a signal to a device under test (DUT) to cause a circuit of the DUT to switch;
detecting a photon emitted from the DUT as a result of a switching event;
placing timing information corresponding to the detected photon in one time bin, among a plurality of time bins that together define a time window, to obtain a time-correlated photon emission count for that bin;
for that switching event, generating a single histogram based on photon emission counts in the bins in the time window; and
measuring a non-periodic statistical variation of the signal at the switching event based on the single histogram.

2. The method of claim 1 wherein the time-correlated photon emission counts in each bin are obtained as a result of multiple switching events.

3. The method of claim 1 wherein measuring the non-periodic statistical variation of the signal at the switching event includes obtaining a representation of a signal output of the DUT by performing a de-convolution technique using the single histogram and a transfer function of a detector that detected the emitted photon.

4. The method of claim 3, further comprising performing the de-convolution technique by taking into account a transit-time-spread of the detector and an inherent jitter.

5. The method of claim 1 wherein measuring the non-periodic statistical variation of the signal comprises measuring a jitter or a skew of the signal.

6. The method of claim 1 wherein the signal comprises a periodic clock signal.

7. The method of claim 1 wherein measuring the non-periodic statistical variation of the signal at the switching event comprises:
determining an intrinsic variation of the signal by providing the signal to the DUT as a low activity pattern;
determining a dynamic variation of the signal by providing the signal to the DUT as a high activity pattern; and
determining an incremental variation by obtaining a difference in widths between a histogram associated with the low activity pattern and a histogram associated with the high activity pattern.

8. The method of claim 7 wherein the low activity pattern comprises a jitter-free clock signal, and wherein the high activity test pattern comprises the clock signal and a jittery return signal from a clock distribution tree on the DUT, as output from an XOR gate coupled to the DUT.

9. The method of claim 1, further comprising performing a calibration procedure by summing a clock signal with a known noise signal as one input to an XOR gate coupled to the DUT, another input of the XOR gate being grounded.

10. The method of claim 1, further comprising:
emitting an analog signal to indicate time of arrival of the emitted photon, the analog signal indicative of a start signal;
generating a trigger signal indicative of a stop signal, the start and stop signals together defining a pulse having an amplitude corresponding the time of arrival of the emitted photon; and
digitizing the pulse to obtain a value of the amplitude and placing the value in a bin.

11. The method of claim 1 wherein the time window comprises a tester loop, the method further comprising providing an acquisition time for a plurality of tester loops, each loop delimited by a reset signal.

12. An apparatus, comprising:
a photon detector positioned to receive a photon emitted from a device under test (DUT) in response to a signal that causes a circuit of the DUT to switch during a switching event; and
a data processing unit coupled to the photon detector to place timing information corresponding to the detected photon in one time bin, among a plurality of time bins that together define a time window, and to obtain a time-correlated photon emission count for that bin, wherein for that switching event, the data processing unit is capable to generate a single histogram based on photon emission counts in the bins in the time window and capable to measure a non-periodic statistical variation of the signal at the switching event based on the single histogram.

13. The apparatus of claim 12 wherein the data processing unit includes a constant fraction discriminator circuit to process an analog signal generated by the photon detector to indicate arrival of the emitted photon.

14. The apparatus of claim 12, further comprising a time-to-amplitude converter (TAC) coupled to the data processing unit, the TAC capable to generate a pulse having an amplitude indicative of a time of arrival of the emitted photon, the data processing unit including an analog-to-digital converter to convert the amplitude of the pulse into a value corresponding to the time of arrival of the emitted photon, the data processing unit capable to place the value into the bin.

15. The apparatus of claim 12, further comprising a tester coupled to the DUT and to the data processing unit to provide the signal to the DUT, the tester further being capable to provide a reset signal to the data processing unit to reset the time window.

16. The apparatus of claim 12, further comprising:
   a summing circuit to receive a clock signal at one input and a known noise signal at another input; and
   an XOR gate having an input coupled to receive an output of the summing circuit, and having an output coupled to the DUT to provide the DUT with a signal having known jitter.

17. The apparatus of claim 16 wherein another input of the XOR gate is grounded.

18. The apparatus of claim 12, further comprising an XOR gate having a first input coupled to receive a clock signal and having a second input coupled to receive a return signal from a clock distribution tree on the DUT, the XOR gate having an output coupled to the circuit of the DUT that switches during the switching event, wherein the data processing unit is capable to determine intrinsic variation in response to having the clock signal provided to the DUT by the XOR gate as a low activity pattern and capable to determine a dynamic variation in response to having the clock signal and the return signal provided to the DUT by the XOR gate as a high activity pattern.

19. The apparatus of claim 18 wherein the data processing unit is capable to determine an incremental variation by obtaining a difference in widths between a histogram associated with the low activity pattern and a histogram associated with the high activity pattern.

20. The apparatus of claim 12 wherein the photon detector comprises a photon-counting photomultiplier tube.

21. A system, comprising:
   a tester to provide a signal to a device under test (DUT) to cause a circuit of the DUT to switch during a switching event;
   a photon detector positioned to receive a photon emitted from the DUT during the switching event in response to the signal; and
   a data processing unit coupled to the photon detector to place timing information corresponding to the detected photon in one time bin, among a plurality of time bins that together define a time window, and to obtain a time-correlated photon emission count for that bin, wherein for that switching event, the data processing unit is capable to generate a single histogram based on photon emission counts in the bins in the time window and capable to measure a non-periodic statistical variation of the signal at the switching event based on the single histogram.

22. The system of claim 21, further comprising a time-to-amplitude converter (TAC) coupled to the data processing unit, the TAC capable to generate a pulse having an amplitude indicative of a time of arrival of the emitted photon, the data processing unit including an analog-to-digital converter to convert the amplitude of the pulse into a value corresponding to the time of arrival of the emitted photon, the data processing unit capable to place the value into the bin.

23. The system of claim 21, further comprising:
   a summing circuit to receive a clock signal at one input and a known noise signal at another input; and
   an XOR gate having an input coupled to receive an output of the summing circuit, and having an output coupled to the DUT to provide the DUT with a signal having known jitter.

24. The system of claim 21, further comprising an XOR gate having a first input coupled to receive a clock signal and having a second input coupled to receive a return signal from a clock distribution tree on the DUT, the XOR gate having an output coupled to the circuit of the DUT that switches during the switching event, wherein the data processing unit is capable to determine an intrinsic variation in response to having the clock signal provided to the DUT by the XOR gate as a low activity pattern and capable to determine a dynamic variation in response to having the clock signal and the return signal provided to the DUT by the XOR gate as a high activity pattern.

25. The system of claim 21 wherein the photon detector comprises a photon-counting photomultiplier tube.

* * * * *